US006572010B2

(12) United States Patent
Dordi et al.

(10) Patent No.: US 6,572,010 B2
(45) Date of Patent: Jun. 3, 2003

(54) INTEGRATED SOLDER BUMP DEPOSITION APPARATUS AND METHOD

(75) Inventors: Yezdi N. Dordi, Palo Alto, CA (US); Robin Cheung, Cupertino, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/880,185

(22) Filed: Jun. 12, 2001

(65) Prior Publication Data

US 2002/0185523 A1 Dec. 12, 2002

(51) Int. Cl.[7] .......................... B23K 1/20; B23K 31/02; B23K 37/04
(52) U.S. Cl. ..................... 228/206; 228/33; 228/49.5; 228/209; 228/215; 228/254; 204/267; 204/269
(58) Field of Search ................. 228/33, 180.21, 228/180.22, 215, 205, 206, 209, 254, 256, 49.1, 49.5; 427/96; 438/613; 257/737, 738; 118/688; 204/267, 269

(56) References Cited

U.S. PATENT DOCUMENTS

| 4,654,116 | A | * | 3/1987 | Spacer | 205/125 |
|---|---|---|---|---|---|
| 4,950,623 | A | | 8/1990 | Dishon | 437/183 |
| 6,013,572 | A | * | 1/2000 | Hur et al. | 257/738 |
| 6,030,512 | A | | 2/2000 | Ihara et al. | 204/224 |
| 6,057,234 | A | * | 5/2000 | Yamazaki | 438/660 |
| 6,071,827 | A | * | 6/2000 | Lim et al. | 134/2 |
| 6,130,158 | A | * | 10/2000 | Hibino | 438/626 |
| 6,144,103 | A | * | 11/2000 | Miller et al. | 257/772 |
| 6,146,984 | A | * | 11/2000 | Leibovitz et al. | 438/613 |
| 6,165,885 | A | * | 12/2000 | Gaynes et al. | 257/737 |
| 6,179,200 | B1 | * | 1/2001 | Kung et al. | 228/174 |
| 6,258,220 | B1 | * | 7/2001 | Dordi et al. | 204/198 |
| 6,268,656 | B1 | * | 7/2001 | Leibovitz et al. | 257/737 |
| 6,426,281 | B1 | * | 7/2002 | Lin et al. | 438/612 |
| 6,426,556 | B1 | * | 7/2002 | Lin | 257/738 |

OTHER PUBLICATIONS

US 2002/0029961 A1 Dordi et al. Mar. 14, 2002.*
US 2002/0033340 A1 Cheung et al. Mar. 21, 2002.*

* cited by examiner

*Primary Examiner*—Tom Dunn
*Assistant Examiner*—Kiley S. Stoner
(74) *Attorney, Agent, or Firm*—Moser, Patterson & Sheridan (57) ABSTRACT

An integrated solder bump deposition method and apparatus that enables solder bumps to be lithographically formed on a substrate. The apparatus comprises a plurality of electrolyte cells, and etch/clean/passthrough station and a reflow chamber.

16 Claims, 3 Drawing Sheets

INTEGRATED SOLDER BUMP DEPOSITION APPARATUS AND METHOD

BACKGROUND OF THE INVENTION

1. Field of the Invention

The present invention relates to an apparatus and method for depositing solder bumps on a substrate.

2. Description of the Background Art

Sub-quarter micron, multi-level metallization is one of the key technologies for the next generation of ultra large scale integration (ULSI) integrated circuits. The multi-level interconnects that lie at the heart of this technology require planarization of interconnect features formed in high aspect ratio apertures, including contacts, vias, lines and other features. Reliable formation of these interconnect features is very important to a success of ULSI and to the continued effort to increase circuit density and quality on individual substrates.

Several methods may be used for forming the necessary electrical interconnections on semiconductor substrates. One method is to utilize lead frames that extend out of a plastics package in which an integrated circuit has been encapsulated in order to connect with an external device. With increasing miniaturization, however, another approach known as "flip-chip" technology has widely come into practice. With "flip-chip" technology, electrical interconnects are provided by means of conductive metal bumps, known as solder bumps, constructed on bond pads that are formed on the top or active surface of the semiconductor substrate. The semiconductor substrate can then be "flipped" and mounted directly to a printed wiring board or other device, with the solder bumps forming the electronic interconnects. "Flip-chip" technology thus eliminates the need for semiconductor packaging and leads to many important advantages over other technologies used to form electrical interconnects including greater miniaturization, better interconnect reliability, higher circuit densities, and cost savings.

"Flip-chip" technology using solder bumps is particularly important for forming interconnects on semiconductor substrates on which copper features have been formed. For several reasons, copper is increasingly used instead of aluminum to form features on semiconductor substrates. As compared with aluminum, copper and its alloys have lower resistivities and significantly higher electromigration resistance. These characteristics support the high current densities experienced at high levels of integration and increase device speed. Copper has become especially favored with trends toward increasing miniaturization of interconnect substrate devices. Attempts at directly bonding wire to copper have proven unsuccessful. Therefore, "flip-chip" technology using solder bumps is employed to form electrical connections on semiconductor substrates on which copper features have been formed.

While several methods of forming solder bumps are available, electroplating has become favored over other methods including screening and evaporation techniques. Evaporation techniques typically involve evaporation of copper chrome and deposition of the material on a semiconductor substrate to form solder bumps. However, evaporation techniques are very expensive and inefficient. With evaporation techniques, typically about half of the material used is wasted. Furthermore, trends toward so-called "very low soft error" microprocesses require the use of so-called "low alpha lead", which is extremely expensive. The electroplating method of forming solder bumps, by contrast, is simple and efficient. Electroplating takes place only on the desired areas of the semiconductor substrate, so that very little material is wasted.

A semiconductor substrate typically undergoes a number of processing steps prior to the solder bump formation processing sequence. Specifically, the surface of a silicon substrate is metallized with a bonding layer of aluminum or copper. Next, a metal under-barrier layer such as copper is deposited on the bonding layer. A photoresist mask layer is then deposited onto the under-barrier layer. Next, the photoresist mask layer is patterned by a lithographic etch process.

After the substrate has been processed in the above manner, the substrate is electroplated with solder. After that, solvent etching of the photoresist mask layer is performed. Next, a cleaning step is performed during which excess under-barrier layer is removed and the substrate is dried. Finally, the substrate is heated in order to reflow the solder, causing the deposited solder to take the desired hemispherical shape of solder bumps.

Each of the steps detailed above following the lithographic etching of the photoresist mask layer generally requires a different system. One system is required to perform electroplating of the substrate with a metal underlayer, another for electroplating of the substrate with solder, another for solvent etching a photoresist mask layer, another for cleaning the substrate, removing the metal under-layer and drying the substrate, and another to reflow the solder. Utilizing a number of different systems and transferring the substrate from one to another in order to form solder bumps is time-consuming and expensive, and reduces throughput of substrates.

Therefore, a need exists in the art for an integrated apparatus and method for performing all of the processing steps necessary to form solder bumps on a substrate.

SUMMARY OF THE INVENTION

The present invention provides an integrated method and apparatus for forming solder bumps on a substrate. The invention provides an integrated apparatus comprising a plurality of electrolytic cells, a lithographic station, a reflow process chamber and an integrated etch/clean/passthrough (ECP) station. The method comprises introducing a substrate having a photoresist pattern defining a location for depositing solder bumps into a transfer position within the apparatus, the substrate is positioned into a deposition position where an electroplating process is performed to deposit a metal underlayer onto the substrate. After the underlayer has been deposited, the substrate is electroplated with solder in a solder electroplating cell, and then transferred to an integrated ECP station to remove the photoresist and clean the substrate. In the last step, the substrate is heated in a solder reflow chamber to form one or more solder bumps on the substrate.

BRIEF DESCRIPTION OF THE DRAWINGS

The teachings of the present invention can be readily understood by considering the following detailed description in conjunction with the accompanying drawings, in which.

DETAILED DESCRIPTION

The present invention generally provides an integrated apparatus and method for depositing solder bumps on a semiconductor substrate. One embodiment of the invention provides an efficient and cost-effective way of forming solder bumps on a semcionductor substrate by providing a single integrated system for electroplating the semiconductor substrate with a metal under-layer, electroplating the semiconductor substrate with solder, etching a photoresist layer, and reflowing the solder. After considering the following description, those skilled in the art will clearly realize that the teachings of the invention can be readily utilized for depositing solder bumps on a substrate.

Figure 1:
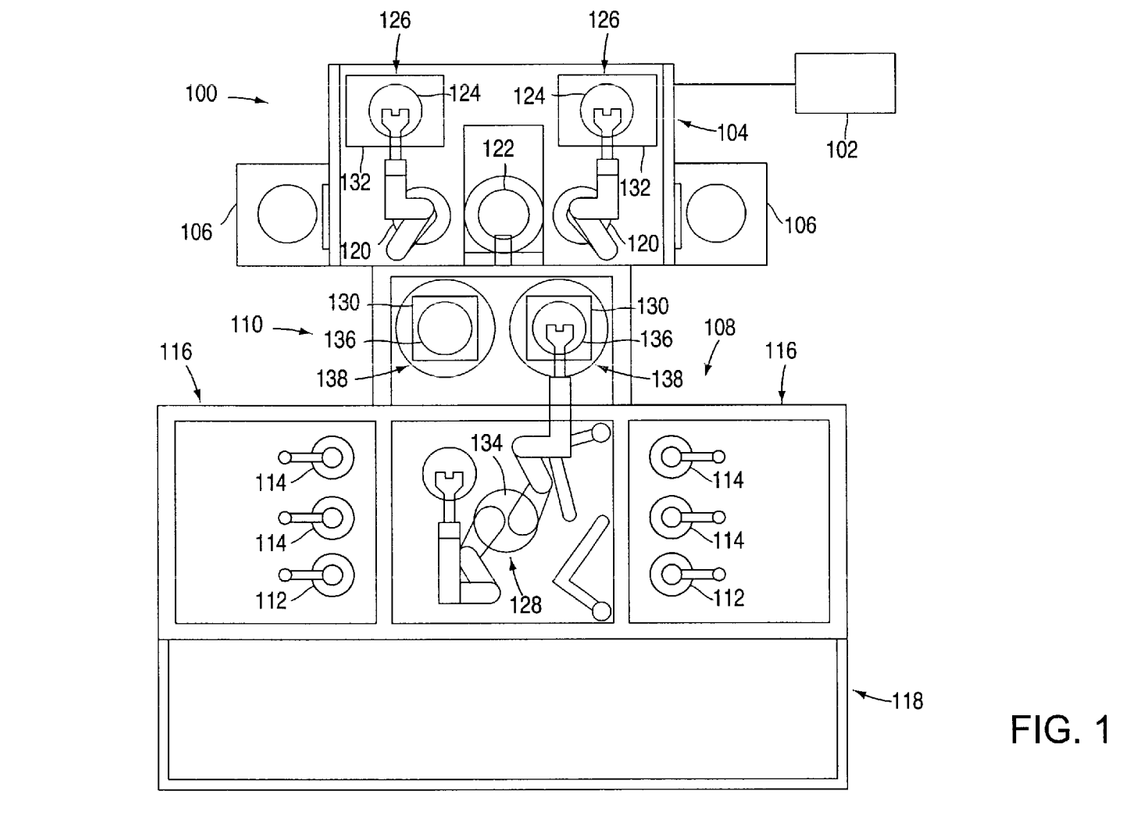
FIG. 1 shows a plan view of the integrated solder bump deposition apparatus.

FIG. 1 depicts a plan view of one embodiment of an integrated solder bump deposition apparatus 100 of the invention. The apparatus 100 comprises a loading position 104, one or more solder reflow chambers 106 (two are shown), ECP station 110, a mainframe 108, and an electrolyte replenishing system 118. The mainframe 108 generally comprises a plurality of processing positions 116 (two are shown) and a mainframe transfer position 128 comprising a mainframe transfer robot 134. Each processing position 116 includes two or more electroplating processing cells 112, 114 (six are shown). The electroplating processing cells 112, 114 include one or more metal underlayer electroplating cells 112 (two are shown) and one or more solder electroplating cells 114 (four are shown). An electrolyte replenishing system 118 providing an electrolyte fluid supply is positioned adjacent to the mainframe 108 and individually connected to the electroplating processing cells 112, 114 to supply and circulate electrolyte fluid for the metal underlayer and solder electroplating processes. The integrated solder bump apparatus 100 also includes a system controller 102, typically comprising a programmable microprocessor, for controlling the solder deposition process.

The loading station 104 includes one or more substrate cassette receiving areas 126 (two are shown), one or more loading station transfer robots 120 (two are shown), and one or more substrate orientors 122. A substrate cassette 132 (two are shown) containing substrates 124 (two are shown) is loaded into the substrate cassette receiving area 126 to introduce substrates 124 into the integrated solder bump deposition apparatus 100. The transfer robot 120 transfers substrates 124 between the substrate cassette 132 and the substrate orientor 122. The transfer robot 120 comprises a typical transfer robot commonly known in the art. The substrate orientor 122 positions each substrate 124 in a desired orientation to insure that the substrate 124 is properly processed. The loading station transfer robot 120 also transfers substrates 124 between the loading station 104 and the ECP station 110. Solvent etch processing, including solvent etching a photoresist layer, is performed on the substrate 124 in the ECP station 110.

Several of the features of the integrated solder bump deposition apparatus 100 described above and in their manner of operation may be similar to features of the electro/chemical deposition system as disclosed in U.S. patent application Ser. No. 09/289,074 filed Apr. 8, 1999 (the '074 application) now U.S. Pat. No. 6,258,220 which is hereby incorporated by reference in its entirety. The electroplating cells 112, 114 may be similar to the processing cells as disclosed in the '074 application. The electrolyte replenishing system 118, mainframe transfer robot 134, loading position transfer robot 120 and substrate pass-through cassette 130 may be similar to the electrolyte replenishing system, mainframe transfer robot, loading position transfer robot, and wafer pass-through cassette, respectively, as disclosed in the '074 application. Additionally, the solder reflow chamber 106 may be similar to the rapid thermal anneal chamber as disclosed in the '074 application.

Figure 2:
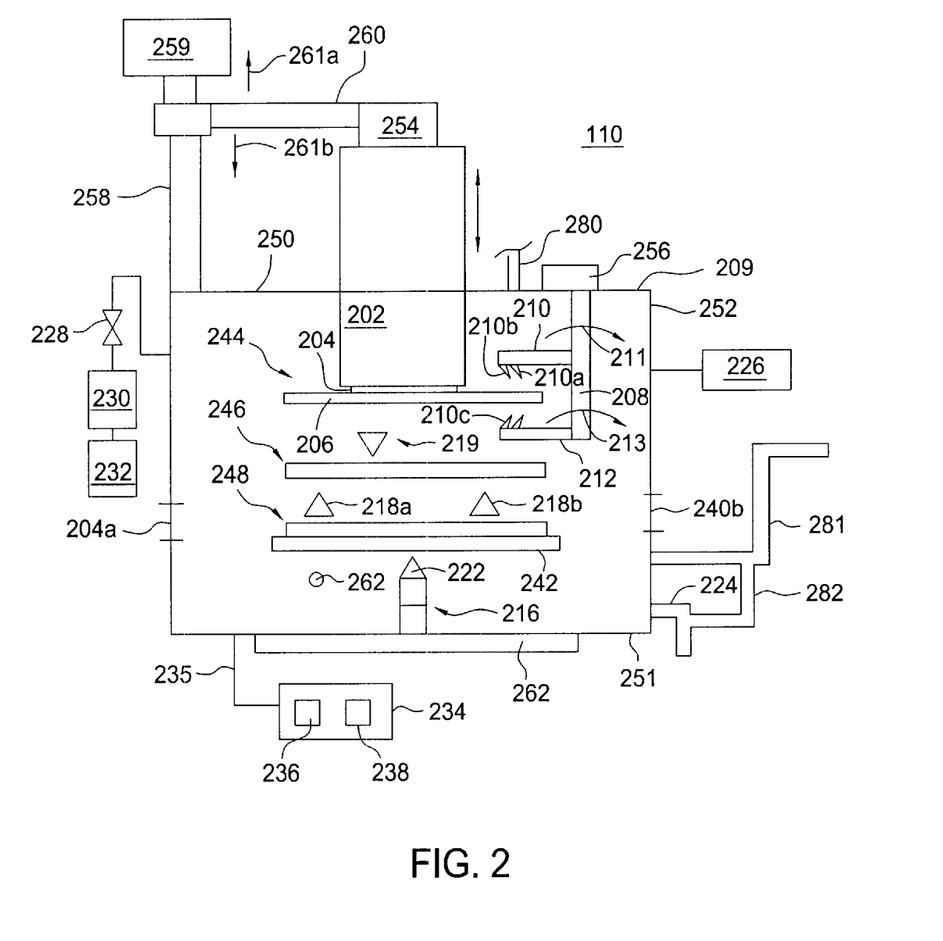
FIG. 2 shows a side cross-sectional view of an integrated ECP apparatus.

FIG. 2 depicts a schematic, cross-sectional view of one embodiment of an ECP station 110. The lid assembly 250 may be coupled to the walls 252 of the ECP station 110 via a hinge or other coupling mechanism so that the lid assembly can be lifted to permit access to the interior of the ECP station 110 for cleaning and/or servicing of the ECP station 110.

Processes and process sequences within the ECP station 110 are preferably controlled by a system controller 234, such as a programmable computer having one or more central processing units (CPUs) 236 and support circuitry containing memory 238 (a computer readable medium) for storing associated control software. The system controller 234 enables automated control of the various processes and process sequences occurring within the EPC station 110 via bi-directional communication with various components of the EPC station 110 through a signal carrier such as signal cables 235.

A drain 224 is disposed in the bottom 251 to allow draining of fluids from the EPC station 110. In one embodiment, the drain 224 has a vented exhaust system to enable constant flow through the drain 224 as fluids are used to process a substrate. The EPC station 110 may also have an exhaust duct 281 proximate the bottom 251 of the EPC station 110. The exhaust duct 281 may have a drain 282 connected to the chamber drain 224 for draining fluids from the exhaust duct 224. To prevent fluids from being drawn into the exhaust duct, the exhaust duct rises above the level of the bottom 251. Filtered air is supplied through a port 280 in the top of the ECP 110. The air exits the ECP 110 through the exhaust duct 281.

The walls 252 comprise one or more openings such as slit valves 240a,b to provide access to the interior of the EPC station 110 by a substrate handler, such as a robot 120 and 128 of FIG. 1, that moves substrates into and out of the EPC station 110. To facilitate high throughput of the EPC station 110, the EPC station 110 may comprise two slit valves 240a and 240b. As such, one slit valve may be used to load a substrate into the EPC station 110 while the other slit valve is used to remove a substrate from the EPC station 110 as the substrates move to and from the processing positions 116.

A spindle assembly 202 is disposed within the EPC station 110 to move a substrate 206 vertically within the EPC station 110 and to rotate, or spin the substrate 206. A substrate gripper, such as a vacuum chuck 204, as is well-known in the art, is disposed on the spindle assembly 202 for gripping the substrate 206. As depicted in FIG. 2, the substrate 106 is "vacuum-chucked" to the vacuum chuck 204.

A spindle assembly linkage 260 is attached to the spindle assembly 202 by a fastener or fasteners such as screws (not shown). The spindle assembly linkage 260 is coupled to a spindle lift 258. The spindle lift 258 comprises an actuator 259 for vertically moving the spindle assembly linkage 260 as shown be arrows 261a,b. The spindle lift actuator 259 may be any form of mechanism that can vertically move the spindle assembly 202 such as a lead screw and stepper motor, ball screw and stepper motor, hydraulic system, rack and pinion assembly and the like.

A spindle assembly motor assembly 254 is coupled to the spindle assembly linkage 260 for causing rotational motion of the vacuum chuck 204 and the substrate 206. As such, the spindle assembly 202 spins the substrate 206.

The interior of the EPC station 110 comprises a transfer area, or transfer position 248, a rinse area, or rinse position 246 and an etch area, or etch position 244. The spindle assembly 202 is used to move the substrate 206 vertically between the process position. In FIG. 2, the substrate 206 is shown positioned at the etch position 244, shown in phantom positioned at the rinse position 246 and shown in phantom positioned at the transfer position 248.

In the embodiment depicted in FIG. 2, the transfer position 248 is under the rinse position 246, the rinse position 248 is under the etch position 244, and the substrate 206 is moved therebetween by the spindle assembly 202 while the substrate 206 is in a face-down position (i.e., with the processing side or front side of the substrate 206 in a face-down position). However, the invention also contemplates embodiments in which the vertical positioning of the stations is opposite that depicted in FIG. 2, and embodiments wherein a substrate is moved and/or processed in a face-up position. For this reason, it is to be understood that terms such as "up", "down", "face-up", "face-down","over", "under" and the like are not intended to limit the invention to the specifically described configuration, but rather are intended only to indicate relative position.

The transfer position 248 comprises a substrate centering hoop 242. The hoop 242 is an annular member with an inwardly sloping inner wall such that the substrate, when released by a substrate handler (not shown) places the substrate 206 in a centrally located position. The substrate handler (robots 120 and 134 of FIG. 1) uses a substrate holder such as an edge gripper or a vacuum chuck to retain the substrate during positioning. The substrate is transported in a face-down orientation and enters the ECP 110 via one of the slit valves 240a,b. The gripper or chuck releases the substrate into the hoop 242. Placement of the substrate 206 in the substrate centering hoop 242 ensures that the substrate 206 is properly aligned to be secured by vacuum suction, or vacuum chucked to the vacuum chuck 204 of the spindle assembly 202.

A hoop rinse dispense arm 216 is disposed under the substrate centering hoop 242. A hoop rinse nozzle 222 is disposed at the end of the hoop rinse dispense arm 216 for dispensing a rinsing fluid such as dionized water to rinse the substrate centering hoop 242.

Two lower substrate rinse nozzles 218(a), (b) and one upper substrate rinse nozzle 219 are positioned as to be able to dispense a rinsing fluid such as deionized water to rinse the substrate 206 while the substrate 206 is positioned at the rinse station 246. The lower rinse nozzle 218(a), (b) are adapted to dispense rinsing fluid upward to the face-down front side of the substrate 206, while the upper rinse nozzle 219 is adapted to dispense rinsing fluid to the face-up backside of the substrate 206 while the substrate 206 is in the rinse station.

Rinsing fluids such as dionized water are provided to the ECP 110 via rinse fluid supply 226 that is located external to the ECP 200 and fluidly connected to the ECP 110. Rinse fluids such as deionized water is delivered through rinse nozzle 222 and the substrate rinse nozzles 218 (a)–(b) 219 by valving (not shown). In the embodiment shown, the rinsing fluid is provided to the ECP 110 without being heated. However, in other embodiments, the rinsing fluid may first be heated before being provided to the ECP 110.

An etchant dispense linkage 208 is disposed within the EPC station 110 and attached thereto an upper dispenser 210 and lower dispenser 212. The upper etchant dispense nozzles 220(a), (b) are disposed at an end of the upper etchant dispenser 210 and a lower etchant dispense nozzle 223 is disposed at an end of the lower dispenser 212. For delivering etchant to the bevel of the substrate 206 positioned at the etch station 244.

Etchant is provided to the EPC station 110 by an etchant supply 232 located external from the EPC station 110 and fluidly connected to the ECP 110. Etchant is heated by an etchant heater 230 before being directed to the upper and lower etchant dispense nozzles 228 (a)–(c) by valving (not shown). A pressure regulator valve 226 controls the flow of etchant to the EPC station 110. An etchant dispense arm linkage motor 256, such as a stepping motor, is coupled to the etchant dispense arm linkage 208 for rotating the etchant dispense arm linkage 208 and the upper and lower etchant dispense arms 210, 212 are shown by arrows 211 and 213.

After rinse processing of the substrate 206, the spindle assembly 202 lifts the substrate 206 to the etch station 248. While the upper and lower etchant dispense arms 210, 212 are in a non-processing position.

Figure 3:
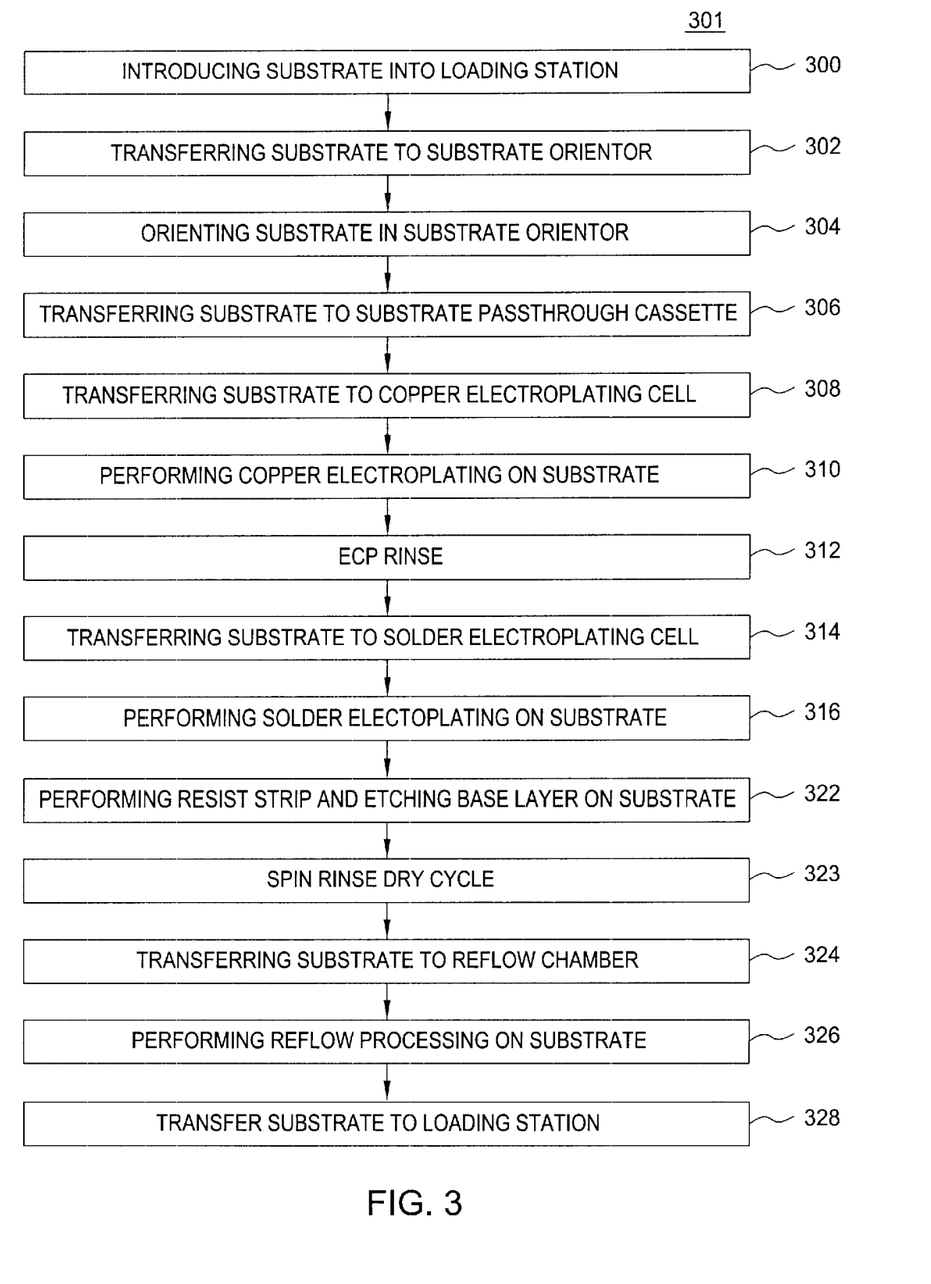
FIG. 3 shows a process flow diagram for a method of depositing solder bumps within the integrated solder bumps deposition apparatus of FIG. 1.

FIG. 3 shows a process flow diagram of a method 301 for the deposition of a solder bump on a substrate utilizing the integrated solder bump deposition apparatus 100 of FIG. 1. To best understand the invention, the reader should simultaneously refer to FIGS. 1 and 3 while reading the following description.

In step 300, a substrate is introduced into the loading station 104 of the integrated solder bump deposition apparatus 100. The substrate is introduced with a photoresist already defining the regions that are to be deposited with the solder bump. Additionally, the substrate comprises a bonding layer that has previously been formed beneath the photoresist layer. In step 302, the loading station transfer robot 120 transfers the substrate 124 from a cassette to the substrate orientor 122.

In step 304, the substrate orientor 122 positions the substrate 124 in a desired orientation to insure the substrate 124 is properly processed. In step 306, the loading station transfer robot 120 transfers the substrate 124 into the substrate pass-through position 248 of the ECP station 110. In step 308, the mainframe transfer robot 134 transfers the substrate 124 from the substrate pass-through position 248 to one of the metal under-layer electroplating processing cells 112.

In step 310, the substrate 124 is electroplated in one of the underlayer electroplating cells 112 with copper as a metal underlayer to prevent diffusion of solder into a bonding layer of the substrate. Preferably, the metal used for the metal underlayer is copper. However, other metals may be used, such as copper or nickel. The electrolyte replenishing unit 118 is configured to provide the appropriate electrolytic fluid to the electroplating cells 112, 114 according to the desired electroplating material. After copper electroplating processing in step 310, the mainframe transfer robot 134 transfers the substrate 124 from the underlayer electroplating processing cell 112 to the ECP station 110. The substrate is moved to the rinse position 246 to clean the substrate in step 312. At step 314, the robot 134 moves the substrate to a solder electroplating processing cell 114.

In step 316, the substrate 124 is electroplated with solder in a solder electroplating processing cell 114 in a pattern that is determined by a photoresist mask layer previously formed on a substrate 124. The solder is made of a metal having a low melting point and may be lead such as low alpha lead as used for so-called "very low soft error" microprocesses, or a lead and tin alloy. The solder bonds to the under layer. In the embodiment shown, two metal underlayer electroplating processing cells 112 and four solder electroplating processing cells 114 are provided. However, other embodiments where a different ratio of metal underlayer electroplating processing cells to solder electroplating cells are contemplated by the invention. After solder electroplating processing, in step 322, the mainframe transfer robot 134 transfers the substrate 124 from the solder electroplating processing cell 114 to the ECP station 110.

In step 322, the substrate 124 is processed in the ECP station 110 wherein the process includes placing the substrate in position 244 and spraying the substrate 124 with an etchant in order to remove the photoresist mask layer. This also acts to etch the base layer on the substrate. Once the photoresist layer is removed and the base layer etched, the substrate is placed in rinse position 246. The substrate is sprayed with the ionized water to clean the substrate 124. The ECP station 110 then optionally spins the substrate 124 dry at step 322. At step 324, the loading station transfer robot 120 transfers the substrate 124 from the ECP station 110 to one of the solder reflow chambers 106.

In step 326, the substrate 124 is heated in the solder reflow chamber 106 to reflow the solder in order to form the solder bumps. Prior to this, the solder is shaped like a mushroom atop the under layer. Lastly, in step 324, the substrate 124 is transferred to the loading station 104 by the loading station transfer robot 120.

The entire process for the deposition of solder bumps, one embodiment of which is described with reference to FIG. 3, is preferably controlled by a system controller 102 (shown in FIG. 1) such as a programmable computer having one or more central processing units (CPUs) and support circuitry containing memory (a computer readable medium) for storing associated control software. The system controller 102 is responsible for automated control of the numerous steps (of FIG. 3) required for deposition of solder bumps on a substrate through bi-directional communication with the various components of the integrated solderable feature deposition apparatus handled by signal cables.

Although various embodiments which incorporate the teachings of the present invention have been shown and described in detail herein, those skilled in the art can readily devise many other varied embodiments that still incorporate these teachings. For example, alternative embodiments are possible wherein various components of the integrated solderable feature deposition apparatus are positioned differently with respect to each other than in the embodiment described herein.

What is claimed is:

1. An integrated solder bump deposition apparatus, comprising:
   a substrate loading station;
   at least two electroplating processing cells;
   an etch/clean/passthrough (ECP) station coupled to the substrate loading station and the at least two electroplating cells; and
   a solder reflow chamber coupled to the substrate loading station.

2. The apparatus of claim 1 further comprising:
   a system controller for controlling a solder bump deposition process.

3. The apparatus of claim 1, wherein the substrate loading station comprises a first transfer robot.

4. The apparatus of claim 1, wherein the substrate loading station comprises:
   at least one cassette receiving area; and
   a substrate orientor.

5. The apparatus of claim 1, wherein the at least two electroplating processing cells comprise at least one underlayer electroplating processing cell and at least one solder electroplating processing cell.

6. The apparatus of claim 5, wherein at least one underlayer electroplating processing cells is for electroplating a metal selected from the group consisting of copper, a copper alloy and a nickel vanadium alloy.

7. The apparatus of claim 5, wherein at least one solder electroplating processing cell is for electroplating with a solder made of a metal selected from the group consisting of lead, tin, a lead alloy and a tin alloy.

8. The apparatus of claim 5, wherein at least one solder electroplating processing cell is for electroplating with a solder made of low alpha lead.

9. The apparatus of claim 1, wherein the ECP station comprises an etch position, a clean position and a passthrough position.

10. The apparatus of claim 1, wherein the ECP station is disposed between the substrate loading station and the at least two electroplating cells.

11. The apparatus of claim 1, wherein the solder reflow chamber comprises a rapid thermal anneal chamber.

12. A method for depositing solder bumps on a substrate comprising a photoresist layer defining locations for the solder bumps within an integrated solder bump deposition apparatus, comprising:
   electroplating solder onto the substrate in one or more electroplating processing cells;
   etching the photoresist layer; and
   reflowing the solder on the substrate.

13. The method of claim 12, wherein the electroplating comprises electroplating an underlayer and electroplating said solder.

14. The method of claim 12, wherein the etching further comprises cleaning the substrate with deionized water.

15. The method of claim 12, wherein the reflowing comprises heating the substrate in a rapid thermal anneal chamber.

16. A method for depositing solder bumps on a substrate comprising a photoresist layer defining locations for the solder bumps, within an integrated solder bump deposition apparatus comprising:
   moving a substrate to an orient chamber;
   orienting the substrate;
   moving the substrate to a clean position of an etch/clean/passthrough (ECP) station;
   transferring the substrate to a passthrough position of the ECP station;
   transferring the substrate from the passthrough position of the ECP station to a copper electroplating cell;
   performing copper deposition on the substrate;
   transferring the substrate to a solder electroplating cell;
   performing solder deposition on the substrate;
   transferring the substrate to the passthrough position of the ECP station;
   moving the substrate to an etch position in the ECP station;
   etching the substrate;
   moving the substrate to a clean position of the ECP station;

cleaning the substrate;
drying the substrate;
transferring the substrate to a reflow chamber;
reflowing the solder; and
transferring the substrate from the reflow chamber to a substrate cassette.

* * * * *

UNITED STATES PATENT AND TRADEMARK OFFICE
CERTIFICATE OF CORRECTION

PATENT NO. : 6,572,010 B2
DATED : June 3, 2003
INVENTOR(S) : Dordi et al.

It is certified that error appears in the above-identified patent and that said Letters Patent is hereby corrected as shown below:

<u>Column 3,</u>
Line 53, please change "insure" to -- ensure --.
Line 54, please change "robot" to -- robots --.
Line 55, please change "transfers" to -- transfer --.

<u>Column 4,</u>
Lines 23, 25, 28, 31, 32, 41 and 43, please change "EPC" to -- ECP --.
Lines 44, 45, 47, 48, 50 and 51, please change "EPC" to -- ECP --.
Line 56, please change "106" to -- 206 --.

<u>Column 5,</u>
Line 5, please change "EPC" to -- ECP --.
Line 9, please change "position" to -- positions --.
Lines 36, 60, 61, 65 and 67, please change "ECP 110" to -- ECP station 110 --.
Line 38, please change "substrate into" to -- substrate 206 into --.
Line 46, please change "dionized" to -- deionized --.
Line 61, please change "ECP 200" to -- ECP station 110 --.

<u>Column 6,</u>
Lines 2, 9, 10 and 15, please change "EPC" to -- ECP --.
Line 11, please change "ECP 110" to -- ECP station 110 --.
Line 21, please change "station" to -- position --.
Lines 60 and 61, please change "substrate" to -- substrate 124 --.

UNITED STATES PATENT AND TRADEMARK OFFICE
CERTIFICATE OF CORRECTION

PATENT NO. : 6,572,010 B2
DATED : June 3, 2003
INVENTOR(S) : Dordi et al.

It is certified that error appears in the above-identified patent and that said Letters Patent is hereby corrected as shown below:

<u>Column 7,</u>
Line 10, please change "322" to -- 316 --.
Lines 17 and 18, please change "base" to -- bonding --.
Line 20, please change "ionized" to -- deionized --.
Line 22, please change "322" to -- 323 --.
Line 27, please change "Prior to" to -- After --.
Line 28, please change "324" to -- 328 --.

Signed and Sealed this

Sixteenth Day of December, 2003

JAMES E. ROGAN
*Director of the United States Patent and Trademark Office*